(12) United States Patent
Jisong

(10) Patent No.: US 11,011,608 B2
(45) Date of Patent: May 18, 2021

(54) SEMICONDUCTOR STRUCTURE AND METHOD FOR FORMING THE SAME

(71) Applicants: Semiconductor Manufacturing International (Shanghai) Corporation, Shanghai (CN); Semiconductor Manufacturing International (Beijing) Corporation, Beijing (CN)

(72) Inventor: Jin Jisong, Shanghai (CN)

(73) Assignees: Semiconductor Manufacturing (Shanghai) International Corporation, Shanghai (CN); Semiconductor Manufacturing (Beijing) International Corporation, Beijing (CN)

( * ) Notice: Subject to any disclaimer, the term of this patent is extended or adjusted under 35 U.S.C. 154(b) by 19 days.

(21) Appl. No.: 16/530,164

(22) Filed: Aug. 2, 2019

(65) Prior Publication Data
US 2020/0343348 A1    Oct. 29, 2020

(30) Foreign Application Priority Data
Apr. 29, 2019  (CN) .......................... 201910356553.3

(51) Int. Cl.
*H01L 29/417*    (2006.01)
*H01L 29/66*    (2006.01)
(Continued)

(52) U.S. Cl.
CPC .... *H01L 29/41725* (2013.01); *H01L 21/0228* (2013.01); *H01L 21/31053* (2013.01);
(Continued)

(58) Field of Classification Search
CPC ......... H01L 29/41725; H01L 21/31116; H01L 21/0228; H01L 29/66545; H01L 21/31053; H01L 21/31144; H01L 29/401
See application file for complete search history.

(56) References Cited

U.S. PATENT DOCUMENTS 9,536,980 B1 *  1/2017  Huang .............. H01L 21/76877
2017/0317079 A1 * 11/2017  Kim .................. H01L 29/66636
(Continued)

*Primary Examiner* — Karen Kusumakar
(74) *Attorney, Agent, or Firm* — Brinks Gilson & Lione

(57) ABSTRACT

A semiconductor structure and a method for forming the same are provided. In one form, the method includes: providing a base, a dummy gate structure being formed on the base, and a source/drain doped layer being formed within the base on both sides of the dummy gate structure; forming a first dielectric layer on the base exposed from the dummy gate structure, the first dielectric layer exposing a portion of a side wall of the dummy gate structure; forming a self-aligned stop layer on at least the side wall of the dummy gate structure exposed from the first dielectric layer; after the self-aligned stop layer is formed, forming a second dielectric layer on the first dielectric layer, and the second dielectric layer and the first dielectric layer being used as interlayer dielectric layers; after the second dielectric layer is formed, replacing the dummy gate structure with a gate structure; etching the interlayer dielectric layer between self-aligned stop layers on side walls of the adjacent gate structures to form a contact exposing the top of the source/drain doped layer; and forming, within the contact, a contact plug electrically connected to the source/drain doped layer. The present disclosure reduces process difficulty in forming a self-aligned contact plug and simplifies a process flow.

22 Claims, 9 Drawing Sheets

(51) Int. Cl.
*H01L 21/311* (2006.01)
*H01L 29/40* (2006.01)
*H01L 21/02* (2006.01)
*H01L 21/3105* (2006.01)

(52) U.S. Cl.
CPC .. *H01L 21/31116* (2013.01); *H01L 21/31144* (2013.01); *H01L 29/401* (2013.01); *H01L 29/66545* (2013.01)

(56) References Cited

U.S. PATENT DOCUMENTS

2019/0164898 A1* 5/2019 Zang ............... H01L 29/785
2019/0259619 A1* 8/2019 Zang ............... H01L 29/4983

* cited by examiner

SEMICONDUCTOR STRUCTURE AND METHOD FOR FORMING THE SAME

RELATED APPLICATIONS

The present application claims priority to Chinese Patent Appln. No. 201910356553.3, filed Apr. 29, 2019, the entire disclosure of which is hereby incorporated by reference.

BACKGROUND

Technical Field

Embodiments and implementations of the present disclosure relate to the field of semiconductor manufacturing, and in particular, to a semiconductor structure and a method for forming the same.

Related Art

As MOSFET devices are scaled down, devices require a high dielectric constant (high k) as a gate insulating layer and metal as a stack structure of gate conductive layers, to suppress high gate leakage due to a polysilicon gate depletion problem and gate capacitance reduction. In order to control a profile of a gate stack more effectively, a gate last process is generally used in the industry, that is, a dummy gate made of polysilicon, etc. is usually deposited on a substrate, and a dummy gate is removed after an interlayer dielectric layer (ILD) is deposited, and then a stack of high k/metal gate (HK/MG) layers is filled in a left gate trench. Thereafter, the ILD is etched to form a contact exposing a source/drain doped layer, and metal material is deposited in the contact to form a contact plug.

However, as device integration increases, device feature sizes continue to shrink, and a gate length and a size of a source/drain region are both scaled down. A relatively small source/drain doped layer size poses a great challenge to a contact process. This is mainly reflected in relatively high requirements on a critical dimension (CD) and overlay for lithography. For example, in order to reduce a series resistance of the contact itself, it is required that a size of the contact is substantially close to the size of the source/drain region. If the size of the contact is significantly smaller than the size of the source/drain region (especially a heavily doped source/drain doped layer), this imposes a relatively high requirement on the critical dimension for lithography. Meanwhile, a contact resistance of a smaller-sized contact plug itself will be larger. In addition, since a distance between the contact and the gate is reduced, a relatively high requirement is imposed on overlap for lithography of the contact. If the overlap is large, a short circuit between the contact plug and the gate is caused.

SUMMARY

A problem to be addressed in embodiments and implementations of the present disclosure is to provide a semiconductor structure and a method for forming the same, so as to reduce process difficulty in forming a self-aligned contact plug and simplify a process flow.

To address the foregoing problem, implementations of the present disclosure provide a method for forming a semiconductor structure. In one form, the method includes: providing a base, a dummy gate structure being formed on the base, and a source/drain doped layer being formed within the base on both sides of the dummy gate structure; forming a first dielectric layer on the base exposed from the dummy gate structure, the first dielectric layer exposing a portion of a side wall of the dummy gate structure; forming a self-aligned stop layer on at least the side wall of the dummy gate structure exposed from the first dielectric layer; after the self-aligned stop layer is formed, forming a second dielectric layer on the first dielectric layer, the second dielectric layer exposing a top of the dummy gate structure, and the second dielectric layer and the first dielectric layer being used as an interlayer dielectric layer; after the second dielectric layer is formed, replacing the dummy gate structure with a gate structure; etching the second dielectric layer interlayer dielectric layer between self-aligned stop layers on side walls of adjacent gate structures to form a contact exposing the top of the source/drain doped layer; and forming a contact plug within the contact, the contact plug being electrically connected to the source/drain doped layer.

Another form of the present disclosure further provides a semiconductor structure, including: a base; a gate structure located on the base; a source/drain doped layer located within the base on both sides of the gate structure; an interlayer dielectric layer located on the base exposed from the gate structure, the interlayer dielectric layer exposing a top of the gate structure, the interlayer dielectric layer including a first dielectric layer and a second dielectric layer located on the first dielectric layer, and the first dielectric layer covering a portion of a side wall of the gate structure; a contact plug located within the interlayer dielectric layer between side walls of adjacent gate structures, the contact plug being electrically connected to the source/drain doped layer; and a self-aligned stop layer located between at least the contact plug and the side wall of the gate structure.

Compared with the prior art, technical solutions of embodiments and implementations of the present disclosure have the following advantages:

Embodiments and implementations of the present disclosure form a self-aligned stop layer on at least the side walls of the dummy gate structure exposed from the first dielectric layer, and a subsequent manufacture procedure further includes: forming a second dielectric layer to constitute an interlayer dielectric layer with the first dielectric layer, after the second dielectric layer is formed, replacing the dummy gate structure with the gate structure, and etching the interlayer dielectric layer between self-aligned stop layers on side walls of adjacent gate structures to form a contact exposing the top of the source/drain doped layer, where the self-aligned stop layers on the side walls of the adjacent gate structures can define stop positions of the contact etching process in a direction perpendicular to side walls of the gate structures in an etching process for forming the contact, to achieve self-alignment in the contact etching process, thereby forming of a self-aligned contact (SAC) plug. In addition, compared with a solution of etching back a portion of the thickness of the gate structure after the gate structure is formed and forming a self-aligned stop layer on the top of a remainder of the gate structure, embodiments and implementations of the present disclosure omits this step, which facilitates simplification of the process flow and reduction of the process difficulty, and has high process compatibility. In summary, embodiments and implementations of the present disclosure reduce difficulty in the process for forming the self-aligned contact plug and simplify the process flow.

DETAILED DESCRIPTION

At present, a process flow for forming a self-aligned contact plug is complicated and the process is relatively difficult. A method for forming a semiconductor structure is now described to analyze reasons for the complicated process flow and the relatively difficult process.

Referring to FIG. 1 to FIG. 5, respective schematic structural diagrams of steps of a method for forming a semiconductor structure are shown.

Figure 1:
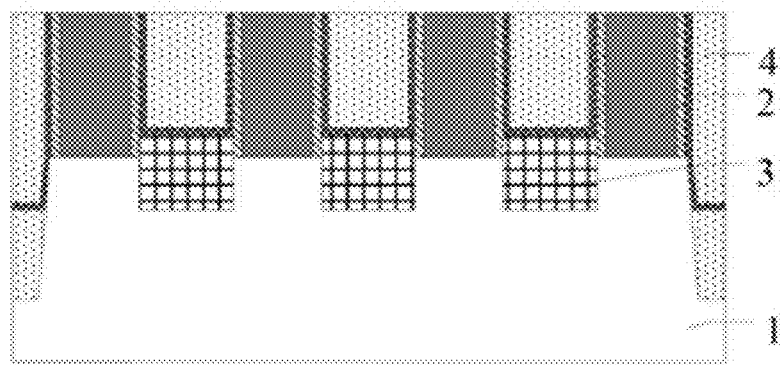
FIG. 1 to FIG. 5 are respective schematic structural diagrams of steps of a method for forming a semiconductor structure.

Referring to FIG. 1, a base 1 is provided, a dummy gate structure 2 being formed on the base 1, a source/drain doped layer 3 being formed within the base 1 on both sides of the dummy gate structure 2, a first dielectric layer 4 being formed on base 1 exposed from the dummy gate structure 2, and the first dielectric layer 4 exposing the top of the dummy gate structure 2.

Figure 2:
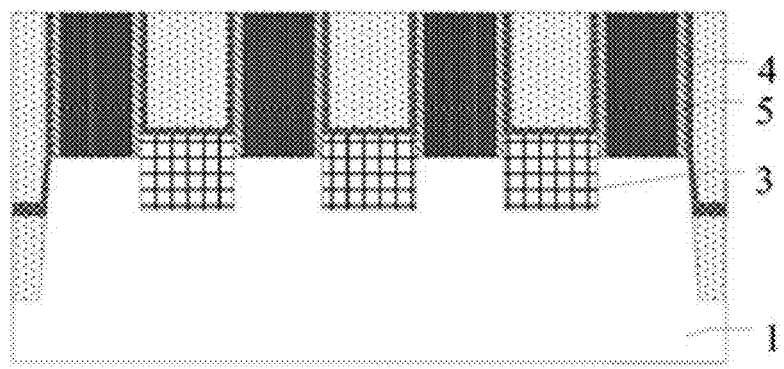

Referring to FIG. 2, the dummy gate structure 2 is replaced with a gate structure 5.

Figure 3:
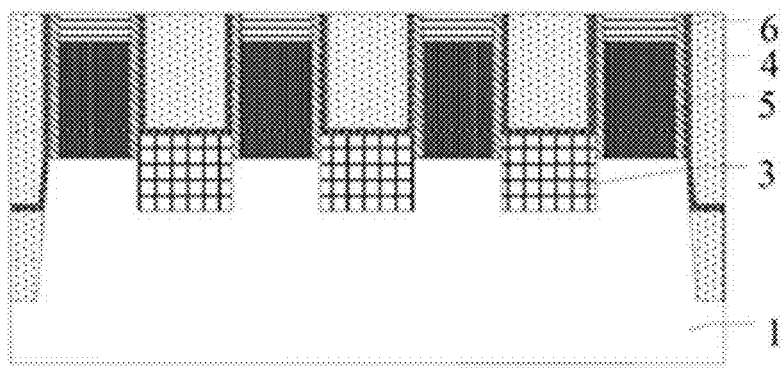

Referring to FIG. 3, a portion of a thickness of the gate structure 5 is etched back to form a groove (not marked) within the first dielectric layer 4; and a self-aligned stop layer 6 filled in the groove is formed. In particular, a step of forming the self-aligned stop layer 6 includes: filling the groove with a self-aligned stop material layer (not shown in the figure), the self-aligned stop material layer further covering the top of the first dielectric layer 4; removing a self-aligned stop material layer above the first dielectric layer 4 using a flattening process, and using a remainder of the self-aligned stop material layer located within the groove as the self-aligned stop layer 6.

Figure 4:
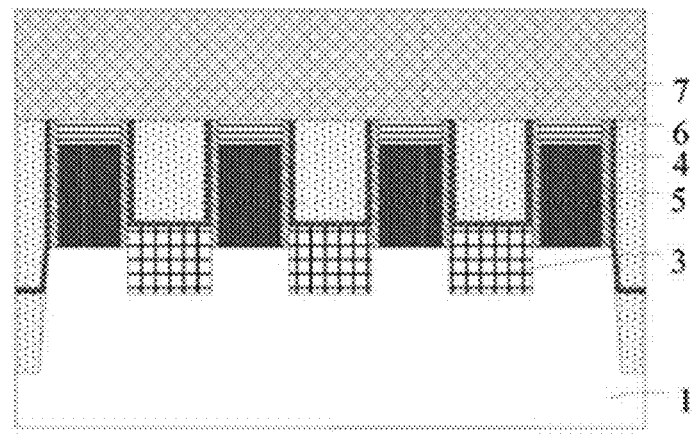

Referring to FIG. 4, a second dielectric layer 7 is formed, which covers the self-aligned stop layer 6 and the first dielectric layer 4.

Figure 5:
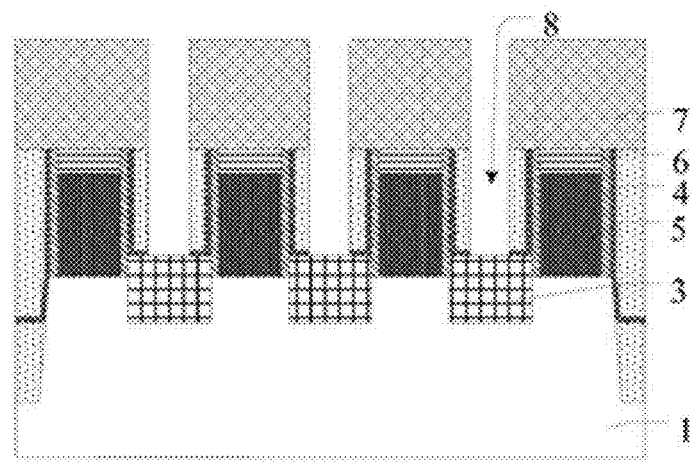

Referring to FIG. 5, the second dielectric layer 7 and the first dielectric layer 4 on both sides of the gate structure 5 are etched to form a contact 8 exposing the source/drain doped layer 3.

In the field of semiconductors, a spacer (not marked) is also formed on the side walls of the gate structure 5 for protecting the side walls of the gate structure 5, and for defining a region for forming the source/drain doped layer 3. The self-aligned stop layer 6 and the spacer can define an etch stop position in a step of forming the contact 8, and therefore, even if there is an overlay shift in the process for forming the contact 8, a loss to the gate structure 5 can be prevented in the contact etching process, thereby achieving self-alignment in the contact 8 process, and preventing a short circuit between a contact plug subsequently filled in the contact 8 and the gate structure 5.

However, in the forming method, it is required to form the dummy gate structure 2 and the gate structure 5 of a height higher than a preset height of the process, which increases a process difficulty in replacing the dummy gate structure 2 with the gate structure 5. In addition, the gate structure 5 is generally a metal gate structure, and therefore a process for etching back a portion of a thickness of the gate structure 5 is relatively difficult, and the process has low stability and is likely to generate large side effects. Furthermore, in a process for forming the etch stop layer 6, defects such as a cavity is likely to be generated within a formed self-aligned stop material layer filled in the groove, and in a step of performing the flattening process, choices for removing the self-aligned stop material layer and the first dielectric layer 4 are few, and it is difficult to control a stop position for the flattening process, and therefore the flattening process is relatively difficult. In summary, the forming method has a complicated process flow and a difficult process.

To address the technical problem, embodiments and implementations of the present disclosure form a self-aligned stop layer on at least the side walls of the dummy gate structure exposed from the first dielectric layer, and a subsequent manufacture procedure further includes: forming a second dielectric layer to constitute an interlayer dielectric layer with the first dielectric layer, after the second dielectric layer is formed, replacing the dummy gate structure with the gate structure, and etching the interlayer dielectric layer between self-aligned stop layers on side walls of adjacent gate structures to form a contact exposing the top of the source/drain doped layer, where the self-aligned stop layers on the side walls of the adjacent gate structures can define stop positions in a direction perpendicular to side walls of the gate structures in an etching process for forming the contact, to achieve self-alignment in the contact etching process, thereby forming of a self-aligned contact plug. In addition, compared with a solution of etching back a portion of the thickness of the gate structure after the gate structure is formed and forming a self-aligned stop layer on the top of a remainder of the gate structure, the embodiments of the present disclosure omits this step, which facilitates simplification of the process flow and reduction of the process difficulty, and has high process compatibility. In summary, the embodiments of the present disclosure reduce difficulty in the process for forming a self-aligned contact plug and simplify the process flow.

In order to make the foregoing objectives, features, and advantages of embodiments and implementations of the present disclosure more apparent and easier to understand, specific embodiments and implementations of the present disclosure are described in detail below with reference to the accompanying drawings.

FIG. 6 to FIG. 16 are respective schematic structural diagrams of steps in one form of a method for forming a semiconductor structure according to the present disclosure.

Figure 6:
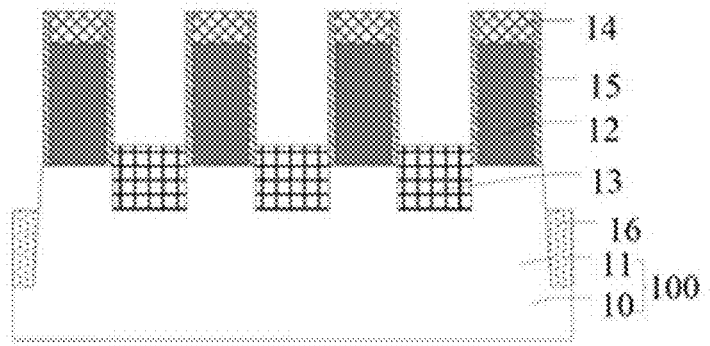
FIG. 6 to FIG. 16 are respective schematic structural diagrams of steps in one form of a method for forming a semiconductor structure according to the present disclosure.

Referring to FIG. 6, a base 100 is provided, a dummy gate structure 12 being formed on the base 100, and a source/drain doped layer 13 being formed within the base 100 on both sides of the dummy gate structure 12.

The base 100 is configured to provide a process platform for a subsequent manufacture procedure of the process.

In some implementations, the base 100 is configured to form a fin field effect transistor (FinFET). Therefore, the base includes a substrate 10 and a fin 11 protruding from the substrate 10. In other implementations, when the base is configured to form a planar field effect transistor, the base includes only a substrate correspondingly.

In some implementations, the substrate 10 is a silicon substrate. In other implementations, the substrate may also be made of other materials such as germanium, silicon germanium, silicon carbide, gallium arsenide, or indium gallium, and the substrate may also be other types of substrates such as a silicon substrate on an insulator or a germanium substrate on an insulator. The substrate may be made of a material suitable for requirements of the process or easy to integrate.

In some implementations, the fin 11 and the substrate 10 are obtained by etching a same semiconductor layer. In other implementations, the fin may also be a semiconductor layer epitaxially growing on the substrate, to control a height of the fin precisely.

Therefore, in some implementations, the fin 11 is made of a material same as that of the substrate 10, and the fin 11 is made of silicon. In other implementations, the fin may also be made of a semiconductor material suitable for forming a fin, such as germanium, silicon germanium, silicon carbide, gallium arsenide, or indium gallium.

It should be noted that the substrate 10 exposed from the fin 11 is also formed with an isolation layer 16, the isolation layer 16 covering a portion of a side wall of the fin 11. The isolation layer 16 is configured to perform isolation between adjacent devices.

In some implementations, the isolation layer 16 is made of silicon oxide. In other implementations, the isolation layer may also be made of other insulating materials such as silicon nitride or silicon oxynitride.

The dummy gate structure 12 is configured to occupy a spatial position for forming a gate structure subsequently. In some implementations, the dummy gate structure 12 crosses a portion of the top and a portion of a side wall of the fin 11.

In some implementations, the dummy gate structure 12 is a single-layer structure, and the dummy gate structure 12 includes only a dummy gate layer (not marked), the dummy gate layer being made of polysilicon.

In other implementations, the dummy gate structure may also be a laminated structure, and the dummy gate structure includes a dummy gate oxide layer and a dummy gate layer located on the dummy gate oxide layer, correspondingly, the dummy gate layer may be made of silicon oxide or silicon oxynitride.

In some implementations, a hard mask layer 14 is further formed on the top of the dummy date structure 12. The hard mask layer 14 is used as an etch mask for forming the dummy date structure 12, and the hard mask layer 14 may be further configured to protect the top of the dummy date structure 12 in a subsequent manufacture procedure of the process. In some implementations, the hard mask layer 14 is made of silicon nitride.

In some implementations, a spacer 15 is further formed on the side walls of the dummy gate structure 12. The spacer 15 is configured to define a region for forming the source/drain doped layer 13 and the spacer 15 is further configured to protect the dummy gate structure 12 and a side wall of the gate structure formed subsequently in the subsequent manufacture procedure of the process.

The spacer 15 may be made of one or more of silicon oxide, silicon nitride, silicon oxynitride, silicon carbide, silicon oxycarbonitride, silicon oxycarbide, boron nitride, and carbon boron nitride, and the spacer 15 may be a single-layer structure or a laminated structure. In some implementations, the spacer 15 is a laminated structure. In particular, the spacer 15 is an ONO (Oxide Nitride Oxide) structure, and the spacer 15 includes a first spacer (not shown in the figure) located on the side wall of the dummy gate structure 12, a second spacer (not shown in the figure) located on a side wall of the first spacer, and a third spacer (not shown in the figure) located on a side wall of the second spacer. Correspondingly, the first spacer is made of silicon oxide, the second spacer is made of silicon nitride, and the third spacer is made of silicon oxide.

In some implementations, the source/drain doped layer 13 is located within the fin 11 on both sides of the dummy gate structure 12.

When a NMOS transistor is formed, the source/drain doped layer 13 includes a stress layer doped with an N-type ion, the stress layer being made of Si or SiC and the stress layer providing a tensile stress function for a channel region of the NMOS transistor, thereby facilitating improvement of a carrier mobility ratio of the NMOS transistor, where the N-type ion is a P ion, an As ion, or an Sb ion.

When a PMOS transistor is formed, the source/drain doped layer 13 includes a stress layer doped with a P-type ion, the stress layer being made of Si or SiGe and the stress layer providing a tensile stress for a channel region of the PMOS transistor, thereby facilitating improvement of a carrier mobility ratio of the PMOS transistor, where the P-type ion is a B ion, a Ga ion, or an In ion.

Figure 7:
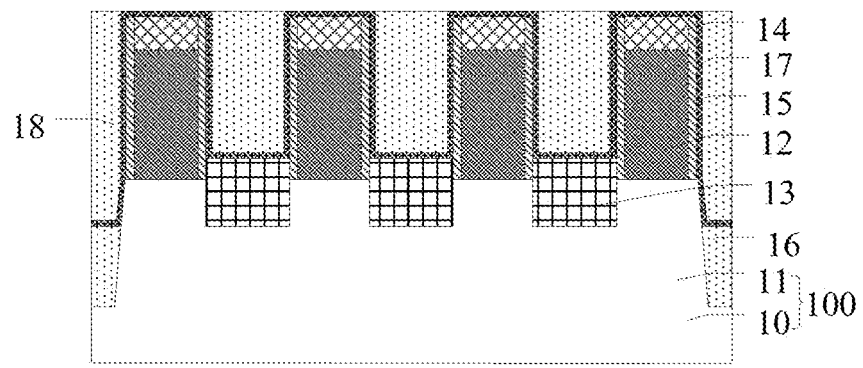
Figure 8:
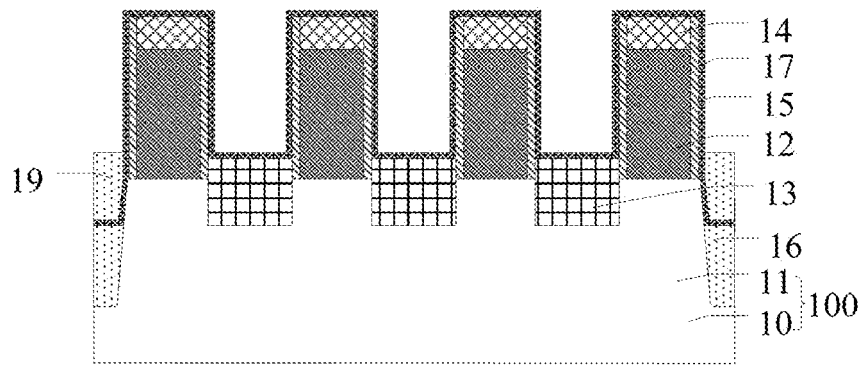

Referring to FIG. 7 to FIG. 8, a first dielectric layer 19 (shown in FIG. 8) is formed on the base 100 exposed from the dummy gate structure 12, the first dielectric layer 19 exposing a portion of a side wall of the dummy gate structure 12.

The first dielectric layer 19 is configured to achieve isolation between adjacent devices and between adjacent dummy gate structures 12, and the first dielectric layer 19 exposes a portion of the side wall of the dummy gate structure 12, thereby preparing for forming a self-aligned stop layer subsequently.

For this purpose, the first dielectric layer 19 is made of a dielectric material such as one or more of silicon oxide, silicon nitride, silicon oxynitride, silicon oxycarbide, silicon carbonitride, and silicon oxycarbonitride. In some implementations, the first dielectric layer 19 is made of silicon oxide.

A distance from the top of the first dielectric layer 19 to the top of the dummy gate structure 12 should be neither excessively small nor excessively large. If the distance is excessively small, a height of the dummy gate structure 12 exposed from the first dielectric layer 19 is excessively small, and correspondingly, a height of a self-aligned stop layer subsequently formed on the side wall of the dummy gate structure 12 exposed from the first dielectric layer 19 is excessively small, making it difficult for the self-aligned stop layer to achieve self-alignment in a subsequent contact etching process. If the distance is excessively large, it is likely to increase difficulty in forming the first dielectric layer 19 and reduce process stability and controllability. For this purpose, in some implementations, the distance from the top of the first dielectric layer 19 to the top of the dummy gate structure 12 is from 200 angstroms to 400 angstroms.

In particular, the first dielectric layer 19 exposes the top of the source/drain doped layer 13, so that the self-aligned stop layer can be formed on the side wall of the dummy gate structure 12 exposed from the source/drain doped layer 13 subsequently, and after the gate structure is formed, the self-aligned stop layer is located on the side wall of the gate structure exposed from the source/drain doped layer 13 correspondingly. In a subsequent etching step of forming the contact, the self-aligned stop layer can protect the side wall of the gate structure exposed from the source/drain doped layer 12, thereby improving an effect of self-alignment of the self-aligned stop layer for achieving the contact etching process, and reducing a probability of causing a loss to the side wall of the gate structure in the contact etching process.

In some implementations, the top of the first dielectric layer 19 is flush with the top of the source/drain doped layer 13, which facilitates further reduction of an influence on the source/drain doped layer 13 from process steps of forming the first dielectric layer 19.

In some implementations, a step of forming the first dielectric layer 19 includes: forming a first dielectric material layer 18 on the base 100 exposed from the dummy gate structure 12, exposing, from the first dielectric material layer 18, the top of the dummy gate structure 12 (shown in FIG. 7); and removing a portion of a thickness of the first dielectric material layer 18, and using a remainder of the first dielectric material layer 18 as the first dielectric layer 19 (shown in FIG. 8).

In some implementations, the first dielectric material layer 18 is formed using a flowable chemical vapor deposition process. The flowable chemical vapor deposition process has a good filling capability, and is suitable for filling an opening of a high depth-to-width ratio, which facilitates improvement of film quality of the first dielectric layer 19.

In some implementations, a portion of the thickness of the first dielectric material layer 18 is removed using a dry etching process. The dry etching process has anisotropic etching characteristics, which facilitates accurate control of a thickness for etching the first dielectric material layer 18, and facilitates improvement of the profile quality of a top surface of the first dielectric layer 19.

It should be noted that, before the first dielectric layer 19 is formed, the method further includes: forming a contact etch stop layer (CESL) 17 that covers the top and the side wall of the dummy gate structure 12 and the base 100 exposed from the dummy gate structure 12.

In particular, the contact etch stop layer 17 covers the top of the source/drain doped layer 13, so that in a subsequent contact etching process, a longitudinal etch stop position of the contact etching process is defined, and a probability of causing a damage to the source/drain doped layer 13 in the contact etching process is reduced.

Correspondingly, the first dielectric layer 19 further covers the contact etch stop layer 17.

In some implementations, the contact etch stop layer 17 is made of silicon nitride.

Figure 9:
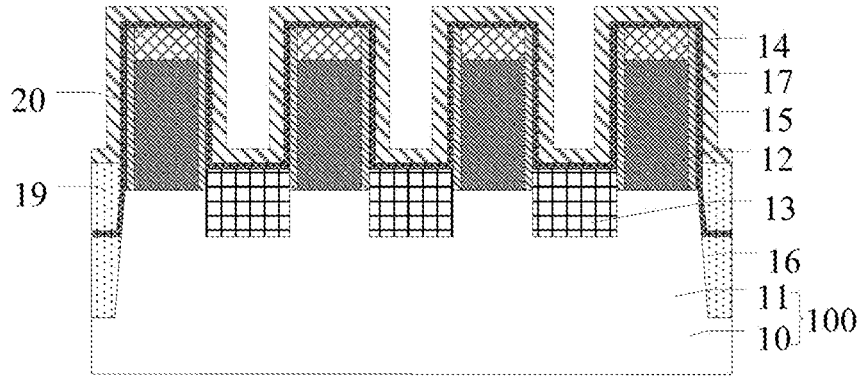
Figure 10:
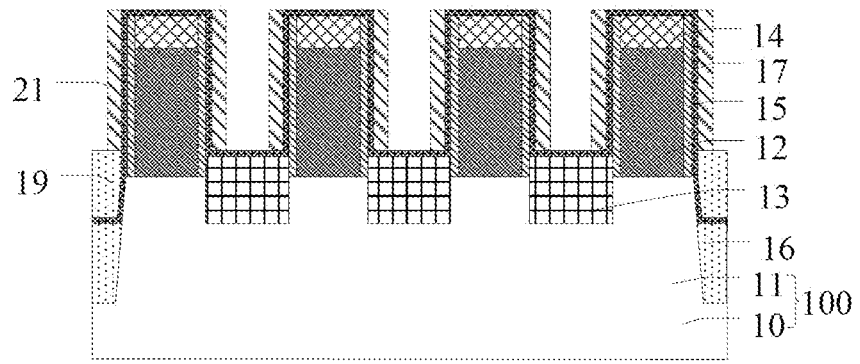

Referring to FIG. 9 to FIG. 10, a self-aligned stop layer 21 is formed on at least the side wall of the dummy gate structure 12 exposed from the first dielectric layer 19.

A subsequent manufacture procedure further includes: forming a second dielectric layer to constitute an interlayer dielectric layer with the first dielectric layer 19, after the second dielectric layer is formed, replacing the dummy gate structure 12 with the gate structure, and etching the interlayer dielectric layer between self-aligned stop layers 21 on the side walls of the adjacent gate structures to form a contact exposing the top of the source/drain doped layer 13, where the self-aligned stop layers 21 on the side walls of the adjacent gate structures can define etch stop positions in a direction perpendicular to side walls of the gate structures in an etching process for forming the contact, to achieve a self-alignment in the contact etching process, thereby forming a self-aligned contact plug. In addition, compared with a solution of etching back a portion of the thickness of the gate structure after the gate structure is formed and forming a self-aligned stop layer on the top of a remainder of the gate structure, embodiments and implementations of the present disclosure omits this step, which facilitates simplification of the process flow and reduction of the process difficulty, and has high process compatibility.

In summary, embodiments and implementations of the present disclosure reduce difficulty of the process in forming a self-aligned contact plug and simplify the process flow.

It should be noted that the self-aligned stop layer 21 in some implementations is not formed between the gate structure and the source/drain doped layer 13, so that the self-aligned stop layer 21 has little influence on a stray capacitance between the gate structure and the source/drain doped layer 13, which helps ensure that performance of a formed semiconductor structure meets process requirements.

Subsequently, the second dielectric layer is generally made of a material that is the same as that of the first dielectric layer 19. In order to ensure that the self-aligned stop layer 21 can define the stop position in the direction perpendicular to the side wall of the gate structure in the contact etching process, the self-aligned stop layer 21 is made of a material having a relatively large etch selection with a material of the first dielectric layer 19. In particular, in a subsequent contact etching process, an etch selection ratio of the material of the first dielectric layer 19 to the material of the self-aligned stop layer 21 is greater than 5:1.

The self-aligned stop layer 21 may be made of silicon nitride, aluminium oxide, aluminium nitride, or NDC (Nitride Doped Carbon). There is a relatively large etch selection ratio between the first dielectric layer 19 and the material, so that it can be ensured that the self-aligned stop layer 21 can achieve a corresponding process effect. In some implementations, the self-aligned stop layer 21 is made of silicon nitride. Silicon nitride is a material commonly used in a semiconductor process that facilitates improvement of process compatibility.

In some implementations, the self-aligned stop layer 21 is located on the side wall of the dummy gate structure 12 exposed from the first dielectric layer 19.

The self-aligned stop layer 21 is located only on the side wall of the dummy gate structure 12 exposed from the first dielectric layer 19, so that a step of etching the self-aligned stop layer 21 on the base 100 is omitted in a subsequent contact etching process, which facilitates prevention of this step from causing a loss to the self-aligned stop layer 21 on the side wall of the gate structure, thereby ensuring a process effect of the self-aligned stop layer 21 for self-alignment.

In some implementations, the step of forming the self-aligned stop layer 21 includes: forming a self-aligned stop material layer 20 that covers the dummy gate structure 12 exposed from the first dielectric layer 16 and the base 100 (shown in FIG. 9) conformally; removing the self-aligned stop material layer 20 on the top of the dummy gate structure 12 and the base 100, and using a remainder of the self-aligned stop material layer 20 as the self-aligned stop layer 21 (shown in FIG. 10).

In some implementations, the self-aligned stop material layer 20 is formed using an atomic layer deposition (ALD) process.

The atomic layer deposition process includes performing multiple atomic layer deposition cycles to form a film of a required thickness. Using the atomic layer deposition process facilitates improvement of thickness uniformity of the self-aligned stop material layer 20, and a thickness of the self-aligned stop layer 21 can be controlled precisely. Furthermore, the atom layer deposition process has good gap filling performance and step coverage, which improves a conformal covering capability of the self-aligned stop material layer 20 correspondingly, thereby improving a covering capability of the self-aligned stop layer 21 on the side wall of the dummy gate structure 12.

Since the self-aligned stop material layer 20 covers the dummy gate structure 12 and the base 100 exposed from the first dielectric layer 16 conformally, the self-aligned stop material layer 20 on the top of the dummy gate structure 12 and the base 100 can be removed using a maskless etching process, which saves a photomask and facilitates reduction of process costs.

In some implementations, the self-aligned stop material layer 20 on the top of the dummy gate structure 12 and on the base 100 is removed using a dry etching process. The dry etching process has anisotropic etching characteristics, so that the self-aligned stop material layer 20 on the top of the dummy gate structure 12 and the base 100 can be removed, and a probability of causing damage to the self-aligned stop material layer 20 on the side wall of the dummy gate structure 12 can be reduced.

The self-aligned stop layer 21 should be neither excessively thin nor excessively thick. If the self-aligned stop layer 21 is excessively thin, not only a thickness of the self-aligned stop layer 21 is likely to be less than an overlay shift of the subsequent contact etching process, causing mis-etching to the gate structure in the contact etching process, but also the self-aligned stop layer 21 is likely to be removed prematurely in the subsequent contact etching process, reducing a self-alignment effect of the self-aligned stop layer 21. If the self-aligned stop layer 21 is excessively thick, not only a time for forming the self-aligned stop layer 21 is likely to be excessively long, resulting in a process time and material waste, but also self-aligned stop layers 21 on the side walls of the adjacent dummy gate structures 12 are likely to be excessively close, and remaining space between the adjacent dummy gate structures 12 is likely to be excessively small, or the self-aligned stop layers 21 on the side walls of the adjacent dummy gate structures 12 may contact with each other, which is likely to increase difficulty of the subsequent contact etching process. For this purpose, in some implementations, the self-aligned stop layer 21 has a thickness from 5 nanometers to 15 nanometers.

Figure 11:
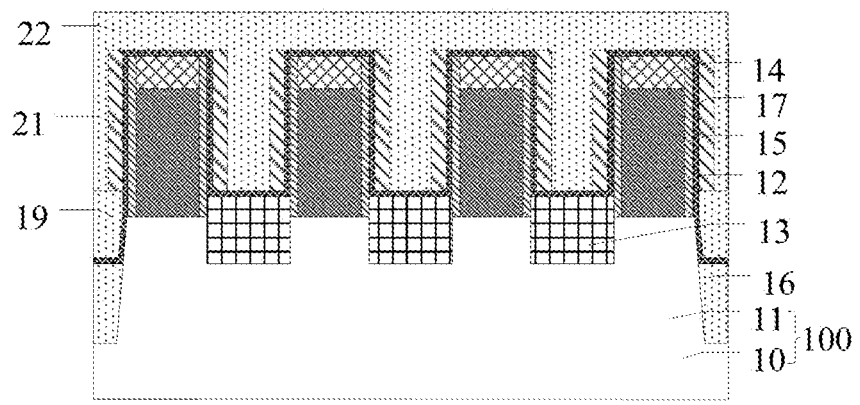
Figure 12:
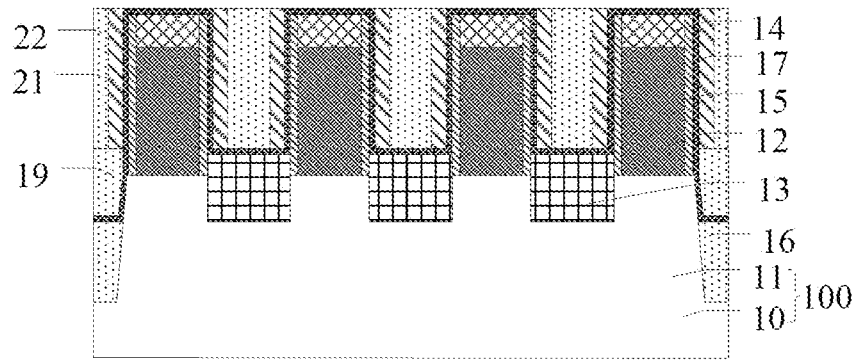
Figure 13:
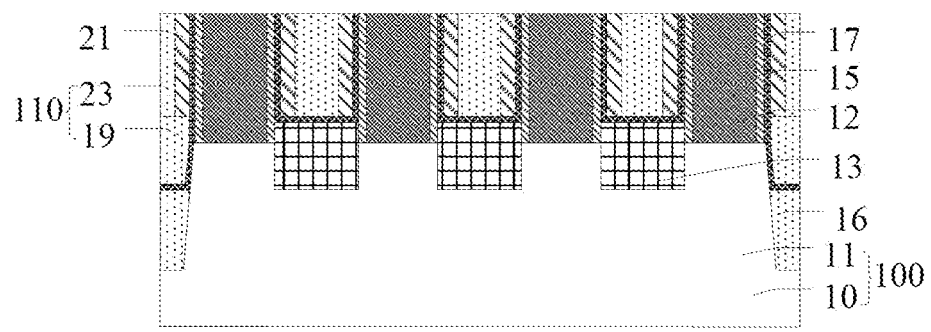

Referring to FIG. 11 to FIG. 13, after the self-aligned stop layer 21 is formed, a second dielectric layer 23 is formed on the first dielectric layer 19, the second dielectric layer 23 exposing the top of the dummy gate structure 12, and the second dielectric layer 23 and the first dielectric layer 19 being used as an interlayer dielectric layer 110.

The interlayer dielectric layer 110 is configured to achieve isolation between adjacent devices, and the interlayer dielectric layer 110 is further configured to provide a process platform for forming a contact plug subsequently.

Enabling the interlayer dielectric layer 110 to expose the top of the dummy gate structure 12 further prepares for replacing the dummy gate structure 12 with a gate structure.

The second dielectric layer 23 is made of a dielectric material such as one or more of silicon oxide, silicon nitride, silicon oxynitride, silicon oxycarbide, silicon carbonitride, and silicon oxycarbonitride. In some implementations, the second dielectric layer 23 is made of a material same as that of the first dielectric layer 19, and the second dielectric layer 23 is made of silicon oxide.

In some implementations, a step of forming the second dielectric layer 23 includes: forming a second dielectric material layer 22 on the first dielectric layer 19, the second dielectric material layer 22 covering the top of the dummy gate structure 12 (shown in FIG. 11); performing a first flattening treatment on the second dielectric material layer 22 using a top surface of the contact etch stop layer 17 on the top of the dummy gate structure 12 as a stop position (shown in FIG. 12); and performing a second flattening treatment on the second dielectric material layer 22 using the top of the dummy gate structure 12 as a stop location, where a remainder of the second dielectric material layer 22 is used as the second dielectric layer 23 after the first flattening treatment is performed (shown in FIG. 13).

In some implementations, the second dielectric material layer 22 is formed using a flowable chemical vapour deposition process. The flowable chemical vapour deposition process has a good filling capability, and is suitable for filling an opening of a high depth-to-width ratio, which facilitates improvement of film quality of the second dielectric material layer 22.

In some implementations, performing the first flattening treatment using a chemical-mechanical polishing process facilitates improvement of a flatness of a top surface of the second dielectric material layer 22 after the first flattening treatment.

In some implementations, the second flattening treatment is performed using a chemical-mechanical polishing process. In particular, in a step of the second flattening treatment, the contact etch stop layer 17 and the hard mask layer 14 on the top of the dummy gate structure 12 are also removed.

Figure 14:
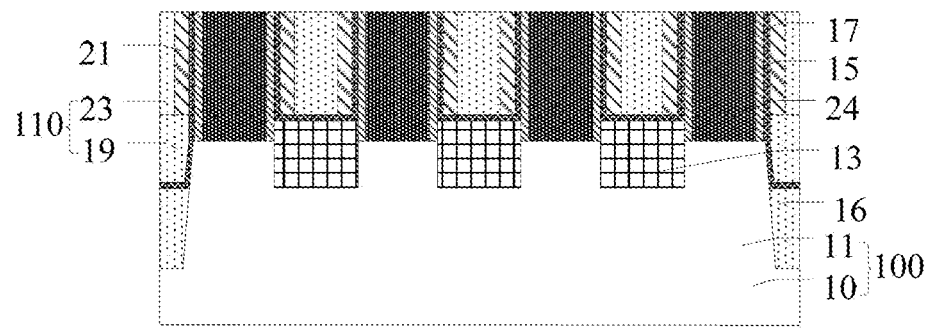

Referring to FIG. 14, after the second dielectric layer 23 is formed, the dummy gate structure 12 is replaced with a gate structure 24.

The gate structure 24 is configured to control the opening or closing of a conductive channel when a semiconductor device operates.

In some implementations, the gate structure 24 is formed using a gate-last process, and the gate structure 24 is a metal gate structure correspondingly, and the gate structure 24 includes a high-k gate dielectric layer (not shown in the figure) and a gate electrode layer (not shown in the figure) located on the high-k gate dielectric layer.

In some implementations, the high-k gate dielectric layer is made of a high-k dielectric material; where the high-k dielectric material refers to a dielectric material having a relative dielectric constant greater than a relative dielectric constant of silicon oxide. In particular, the high-k gate dielectric layer is made of $HfO_2$. In other implementations, the high-k gate dielectric layer may also be made of a material selected from $ZrO_2$, HfSiO, HfSiON, HfTaO, HfTiO, HfZrO, or $Al_2O_3$.

The gate electrode layer is made of Al, Cu, Ag, Au, Pt, Ni, Ti, or W. In some implementations, the gate electrode layer is made of W.

In particular, a step of replacing the dummy gate structure 12 with the gate structure 24 includes: removing the dummy gate structure 12, forming a gate opening (not shown in the figure) within the interlayer dielectric layer 110 and forming the gate structure 24 within the gate opening.

Figure 15:
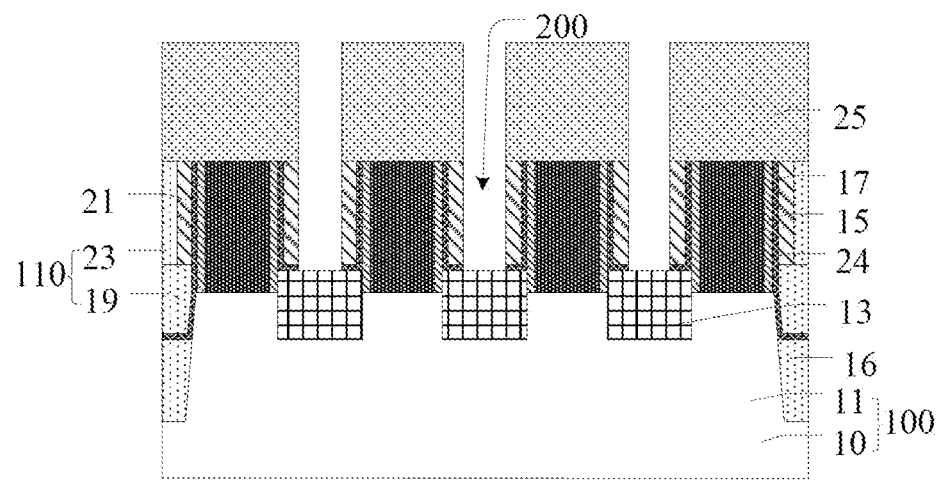

Referring to FIG. 15, an interlayer dielectric layer 110 between self-aligned stop layers 21 on side walls of adjacent gate structures 24 is etched to form a contact 200 exposing the top of the source/drain doped layer 13.

The contact 200 is configured to provide a spatial position for a forming a contact plug subsequently.

In an etching process for forming the contact 200, the self-aligned stop layers 21 on the side walls of the adjacent gate structures 24 can define etch stop positions in a direction perpendicular to the side walls of the gate structures 24. When there is an overlay shift in the contact etching process, it is also difficult to cause a loss to the gate structure 24, so that self-alignment in the contact etching process is achieved, thereby forming a self-aligned contact plug.

In some implementations, a step of forming the contact 200 includes: forming a mask layer (not shown in the figure) on the interlayer dielectric layer 110, the mask layer having a mask opening (not shown in the figure), and being suitable for defining a position and a shape for etching the contact 200; etching the interlayer dielectric layer 110 using the mask layer as a mask to form the contact 200 exposing the top of the source/drain doped layer 13.

In some implementations, the mask layer is made of photoresist.

In some implementations, in a step of etching the interlayer dielectric layer 110, the contact etch stop layer 17 located on the top of the source/drain doped layer 13 is a longitudinal etch stop position, and an initial contact (not shown in the figure) is formed within the interlayer dielectric layer 110; and the contact etch stop layer 17 at a bottom of the initial contact is etched to form the contact 200.

The contact etch stop layer 17 located on the top of the source/drain doped layer 13 is used as a longitudinal etch stop position, so that a probability of causing a damage to the top of the source/drain doped layer 13 is reduced.

In some implementations, after the contact 200 is formed, the method further includes: removing the mask layer. Correspondingly, the mask layer can be removed using an ashing process.

It should be noted that, in some implementations, after the gate structure 24 is formed and before the contact 200 is formed, the method further includes: forming a third dielectric layer 25 covering the gate structure 24 and the second dielectric layer 23.

The third dielectric layer 25 is configured to provide a process platform for subsequently forming a gate contact plug electrically connected to the gate structure 24, and the third dielectric layer 25 is further configured to achieve subsequent isolation between adjacent gate contact plugs. In some implementations, the third dielectric layer 25 is made of a material same as that of the second dielectric layer 23, and the third dielectric layer 25 is made of silicon oxide.

Therefore, in a step of forming the mask layer, the mask layer is located on the third dielectric layer 25, and the mask opening exposes a portion of the top of the third dielectric layer 25 between the adjacent gate structures 24.

Correspondingly, before the interlayer dielectric layer 110 is etched, the method further includes: etching the third dielectric layer 25 using the mask layer as a mask.

The mask opening exposes the portion of the top of the third dielectric layer 25 between the adjacent gate structures 24 to reduce a width size of the mask opening appropriately, thereby avoiding a problem of mis-etching the top of the gate structure 24 due to an overlay shift of the mask opening in a step of etching the third dielectric layer 25. The width size refers to a size of the mask opening in a direction perpendicular to the side wall of the gate structure 24.

Correspondingly, after the third dielectric layer 25 is etched, a lateral etch region of the interlayer dielectric layer 110 may be adjusted according to a size of the contact 200 actually required. In particular, in some implementations, in a step of etching the interlayer dielectric layer 110, a side wall of the self-aligned stop layer 21 is also etched.

Figure 16:
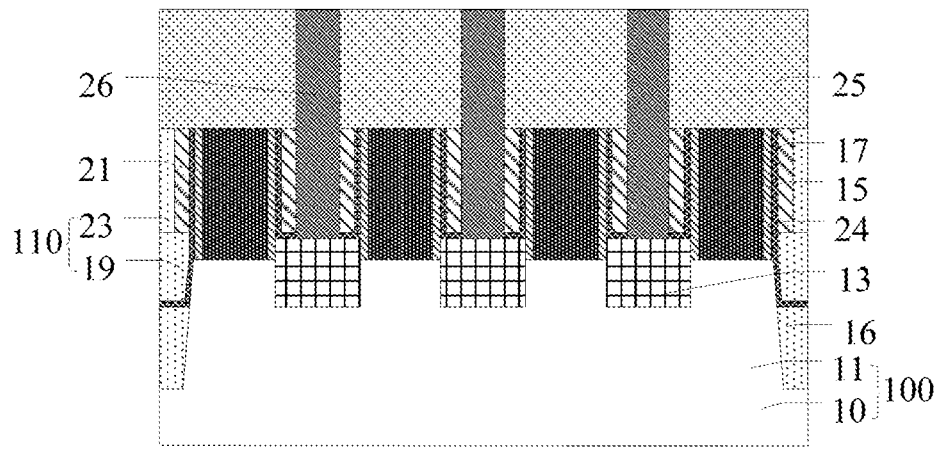

Referring to FIG. 16, a contact plug 26 is formed within the contact 200, the contact plug 26 being electrically connected to the source/drain doped layer 13. The contact plug 26 is configured to achieve an electrical connection of the source/drain doped layer 13 to an external circuit or other interconnecting structures.

As can be seen from the above, a probability that the contact 200 exposes the gate structure 24 is relatively low, and a probability that the contact plug 26 is short-circuited with the gate structure 24 is also relatively low.

In some implementations, the contact plug 26 is made of copper. A relatively lower resistivity of copper facilitates improvement of a signal delay of a back end of line RC, improvement of a processing speed of a chip, and also facilitates reduction of a resistance of the contact plug 26, reducing power consumption correspondingly.

In some implementations, the contact plug 26 is formed using an electroplating (ECP) process.

In other implementations, the contact plug may also be made of tungsten or cobalt. Correspondingly, the contact plug may be formed using a chemical vapor deposition process.

FIG. 17 to FIG. 22 show respective schematic structural diagrams of steps in another embodiment of a method for forming a semiconductor structure according to the present disclosure.

Similarities between some implementations and the foregoing embodiments are not described herein again. A difference between some implementations and the foregoing embodiments is that a position for forming the self-aligned stop layer is different from that in the foregoing embodiments in a step of forming the self-aligned stop layer.

Figure 17:
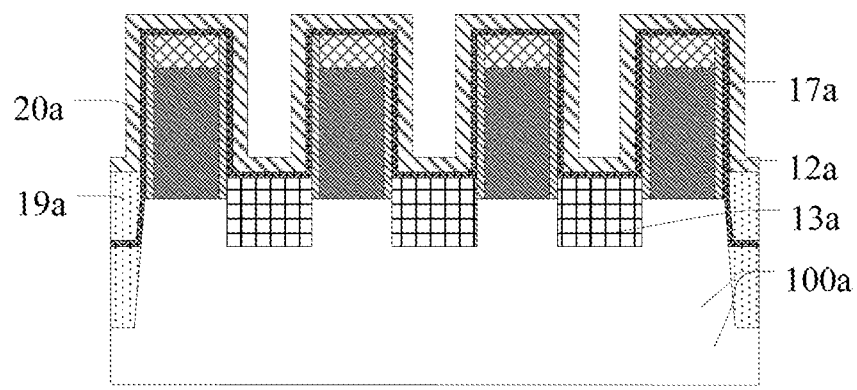
FIG. 17 to FIG. 22 are respective schematic structural diagrams of steps in another form of a method for forming a semiconductor structure according to the present disclosure.

Referring to FIG. 17, a self-aligned stop layer 20*a* is formed on at least a side wall of a dummy gate structure 12*a* exposed from a first dielectric layer 19*a*.

In some implementations, the self-aligned stop layer 20*a* covers the dummy gate structure 12*a* and the base 100*a* exposed from the first dielectric layer 19*a* conformally. In particular, the self-aligned stop layer 20*a* covers tops of the dummy gate structure 12*a* and a source/drain doped layer 13*a* exposed from the first dielectric layer 19*a* conformally, and the self-aligned stop layer 20*a* further covers the top of the first dielectric layer 19*a*.

Therefore, in some implementations, a step of removing the base 100*a* located on the top of the dummy gate structure 12*a* and exposed from the dummy gate structure 12*a* is not additionally required, so that a step of placing the base 100*a* into another etching machine is omitted. In a subsequent contact etching process, the self-aligned stop layer 20*a* located on the base 100*a* can be removed merely by adjusting an etching gas type and a process parameter in a same etching machine, thereby simplifying a process flow, which facilitates improvement of a production capacity.

Figure 18:
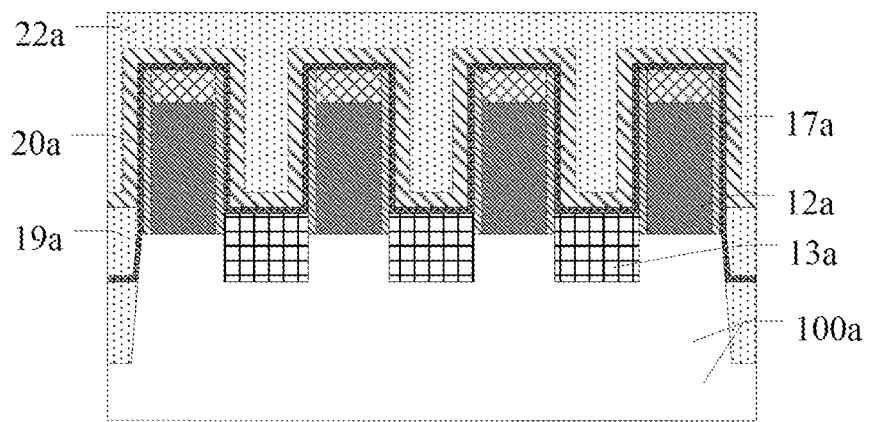
Figure 19:
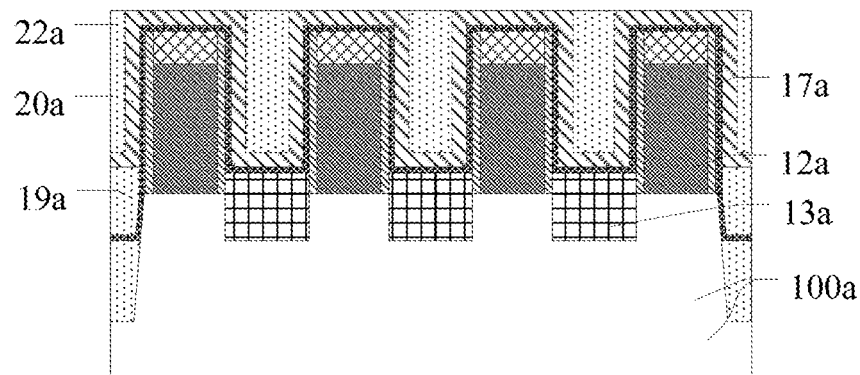
Figure 20:
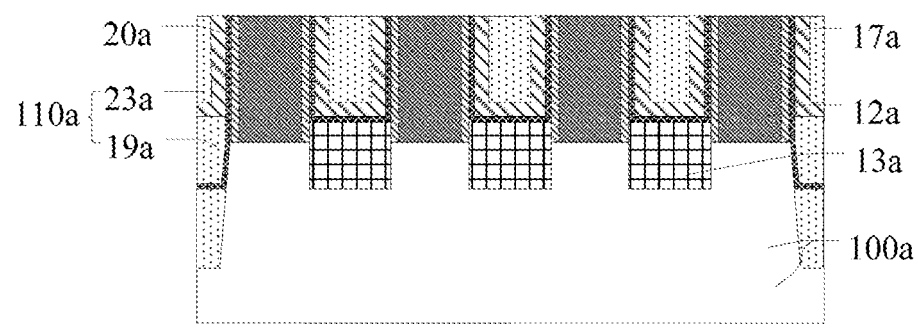

Referring to FIG. 18 to FIG. 20, after the self-aligned stop layer 20*a* is formed, a second dielectric layer 23*a* is formed on the first dielectric layer 19*a* (shown in FIG. 20), the second dielectric layer 23*a* exposing the top of the dummy gate structure 12*a*, and the second dielectric layer 23*a* and the first dielectric layer 19*a* being used as an interlayer dielectric layer 110*a* (shown in FIG. 20).

In some implementations, a step of forming the second dielectric layer 23*a* includes: forming a second dielectric material layer 22*a* on the first dielectric layer 19*a* (shown in FIG. 18), the second dielectric material layer 22*a* covering the self-aligned stop layer 20*a* on the top of the dummy gate structure 12*a*; removing a second dielectric material layer 22*a* above the top of the dummy gate structure 12*a*, and using a remainder of the second dielectric material layer 22*a* as the second dielectric layer 23*a* (shown in FIG. 19 and FIG. 20).

In some implementations, in a step of removing the second dielectric material layer 22*a* above the top of the dummy gate structure 12*a*, a self-aligned stop layer 20*a* above the top of the dummy gate structure 12*a* is removed.

In particular, the step of removing the second dielectric material layer 22*a* above the top of the dummy gate structure 12*a* includes: performing a first flattening treatment on the second dielectric material layer 22*a* using a top surface of the self-aligned stop layer 20*a* on the top of the dummy gate structure 12a as a stop position (shown in FIG. 19); performing a second flattening treatment on the second dielectric material layer 22a and the self-aligned stop layer 20a using the top of the dummy gate structure 12a as a stop position after the first flattening treatment is performed (shown in FIG. 20).

Figure 21:
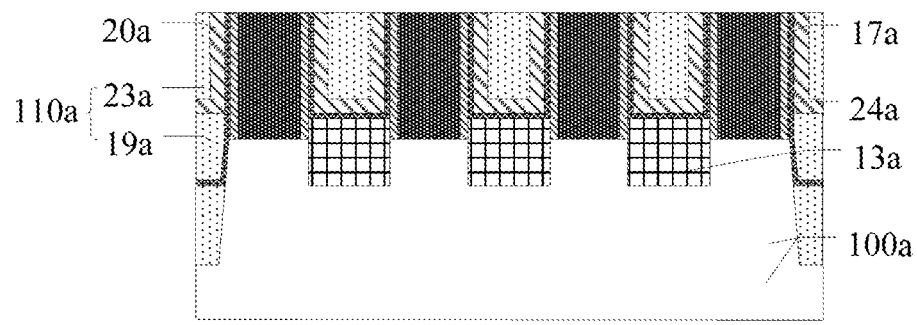

Referring to FIG. 21, after the second dielectric layer 23a is formed, the dummy gate structure 12a is replaced with a gate structure 24a.

A step of replacing the dummy gate structure 12a with the gate structure 24a is the same as that in the foregoing embodiments, and details are not described herein again in some implementations.

Figure 22:
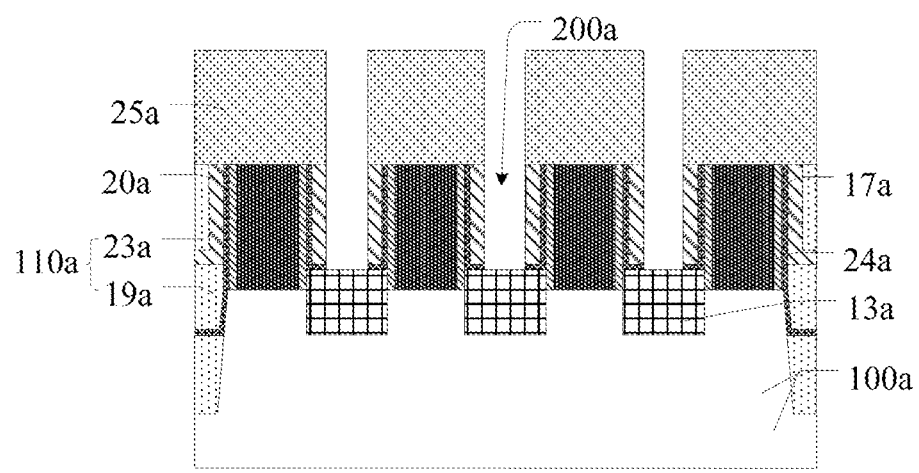

Referring to FIG. 22, an interlayer dielectric layer 110a between self-aligned stop layers 20a on side walls of adjacent gate structures 24a is etched to form a contact 200a exposing the top of the source/drain doped layer 13a.

In some implementations, a step of forming the contact 200a further includes: etching the self-aligned stop layer 20a on the base 100a.

In some implementations, the self-aligned stop layer 20a covers the top of the source/drain doped layer 13a and the top of the first dielectric layer 19a, and therefore, after the second dielectric layer 23a is etched, the self-aligned stop layer 20a on the top of the source/drain doped layer 13a is etched to form an initial contact (not shown in the figure). A contact etch stop layer 17a on a bottom of the initial contact is etched to form the contact 200a.

In particular, after the second dielectric layer 23a is etched, the self-aligned stop layer 20a on the top of the source/drain doped layer 13a is etched by adjusting an etching gas type and an etching process parameter in a same etching machine.

Subsequent steps are the same as those in the foregoing embodiments, and are not described herein again.

The present disclosure further provides a semiconductor structure. Referring to FIG. 16, a schematic structural diagram of one form of a semiconductor structure according to the present disclosure is shown.

The semiconductor structure includes: a base 100; a gate structure 24 located on the base 100; a source/drain doped layer 13 located within the base 100 on both sides of the gate structure 24; an interlayer dielectric layer 110 located on the base 100 exposed from the gate structure 24, the interlayer dielectric layer 110 exposing the top of the gate structure 24, the interlayer dielectric layer 110 including a first dielectric layer 19 and a second dielectric layer 23 located on the first dielectric layer 19, and the first dielectric layer 19 covering a portion of a side wall of the gate structure 24; a contact plug 26 located within the interlayer dielectric layer 110 between side walls of adjacent gate structures 24, the contact plug 26 being electrically connected to the source/drain doped layer 13; and a self-aligned stop layer 21 located between at least the contact plug 26 and the side wall of the gate structure 24.

In a contact etching process for forming the contact plug 26, the self-aligned stop layers 21 on the side walls of the adjacent gate structures 24 can define etch stop positions in a direction perpendicular to the side walls of the gate structures 24. Even when there is an overlay shift in the contact etching process, the gate structure 24 can be prevented from being damaged with the self-aligned stop layer 21, thereby achieving self-alignment in the contact etching process and preventing a short circuit from occurring between the contact plug 26 and the gate structure 24. In addition, compared with a solution of disposing a self-aligned stop layer on the top of the gate structure, in some implementations, steps of etching back a portion of a thickness of the gate structure and forming a self-alignment on the top of a remainder of the gate structure are omitted, which facilitates simplification of a process flow and reduction of process difficulty, and have high process compatibility. Furthermore, the self-aligned stop layer 21 in some implementations is not located between the gate structure 24 and the source/drain doped layer 13, so that the self-aligned stop layer 21 has little influence on a stray capacitance between the gate structure 24 and the source/drain doped layer 13, which helps ensure that performance of a semiconductor structure meets process requirements.

In summary, some implementations of the present disclosure reduces difficulty in forming the self-aligned contact plug 26 and simplifies the process flow while ensuring the performance of the semiconductor structure.

In some implementations, the semiconductor structure is a fin field effect transistor. Therefore, the base includes a substrate 10 and a fin 11 protruding from the substrate 10. In other implementations, when the semiconductor structure is a planar field effect transistor, the base includes only the substrate correspondingly.

In some implementations, the substrate 10 is a silicon substrate. In other implementations, the substrate may also be made of other materials such as germanium, silicon germanium, silicon carbide, gallium arsenide, or indium gallium, and the substrate may also be other types of substrates such as a silicon substrate on an insulator or a germanium substrate on the insulator. The substrate may be made of a material suitable for the process or easy to integrate.

In some implementations, the fin 11 is made of a material same as that of the substrate 10, and the fin 11 is made of silicon. In other implementations, the fin may also be made of a semiconductor material suitable for forming a fin, such as germanium, silicon germanium, silicon carbide, gallium arsenide, or indium gallium.

The semiconductor structure further includes an isolation layer 16 located on the substrate 10 exposed from the fin 11, the isolation layer 16 covering a portion of a side wall of the fin 11. The isolation layer 16 is configured to perform isolation between adjacent devices.

In some implementations, the isolation layer 16 is made of silicon oxide. In other implementations, the isolation layer may also be made of other insulating materials such as silicon nitride or silicon oxynitride.

In some implementations, the gate structure 24 is formed using a gate-last process, and the gate structure 24 is a metal gate structure correspondingly, and the gate structure 24 includes a high-k gate dielectric layer (not shown in the figure) and a gate electrode layer (not shown in the figure) located on the high-k gate dielectric layer.

In some implementations, the high-k gate dielectric layer is made of a high-k dielectric material. In particular, the high-k gate dielectric layer is made of $HfO_2$. In other implementations, the high-k gate dielectric layer may also be made of a material selected from $ZrO_2$, HfSiO, HfSiON, HfTaO, HfTiO, HfZrO, or $Al_2O_3$.

The gate electrode layer is made of Al, Cu, Ag, Au, Pt, Ni, Ti, or W. In some implementations, the gate electrode layer is made of W.

In some implementations, a spacer 15 is further formed on the side wall of the gate structure 24 for defining a region for forming the source/drain doped layer 13, and the spacer 15 is further configured to protect the side wall of the gate structure 24 in a manufacture procedure of a process for forming a semiconductor structure.

The spacer 15 may be made of one or more of silicon oxide, silicon nitride, silicon oxynitride, silicon carbide, silicon oxycarbonitride, silicon oxycarbide, boron nitride, and carbon boron nitride, and the spacer 15 may be a single-layer structure or a laminated structure. In some implementations, the spacer 15 is a laminated structure. In particular, the spacer 15 is an ONO structure.

In some implementations, the source/drain doped layer 13 is located within the fin 11 on both sides of the gate structure 24.

When the semiconductor structure is an NMOS transistor, the source/drain doped layer 13 includes a stress layer doped with an N-type ion, the stress layer being made of Si or SiC and the stress layer providing a tensile stress function for a channel region of the NMOS transistor, thereby facilitating improvement of a carrier mobility ratio of the NMOS transistor, where the N-type ion is a P ion, an As ion, or an Sb ion. When the semiconductor structure is a PMOS transistor, the source/drain doped layer 13 includes a stress layer doped with a P-type ion, the stress layer being made of Si or SiGe and the stress layer providing a compressive stress function for a channel region of the PMOS transistor, thereby facilitating improvement of a carrier mobility ratio of the PMOS transistor, where the P-type ion is a B ion, a Ga ion, or an In ion.

The interlayer dielectric layer 110 is configured to achieve isolation between adjacent devices, and the interlayer dielectric layer 110 is further configured to provide a process platform for forming a contact plug 26.

The interlayer dielectric layer 19 is configured to achieve isolation between adjacent devices, and the interlayer dielectric layer 19 further provides a process platform for forming a self-aligned stop layer 21.

For this purpose, the first dielectric layer 19 is made of a dielectric material such as one or more of silicon oxide, silicon nitride, silicon oxynitride, silicon oxycarbide, silicon carbonitride, and silicon oxycarbonitride. In some implementations, the first dielectric layer 19 is made of silicon oxide.

A distance from the top of the first dielectric layer 19 to the top of the gate structure 24 should be neither excessively small nor excessively large. If the distance is excessively small, a height of the gate structure 24 exposed from the first dielectric layer 19 is excessively small, and correspondingly a height of a self-aligned stop layer 21 located on the side wall of the gate structure 24 exposed from the first dielectric layer 19 is excessively small, which is likely to make it difficult for the self-aligned stop layer 21 to achieve self-alignment in a contact etching process; or if the distance is excessively large, it is likely to increase difficulty in forming the first dielectric layer 19 and reduce process stability in this step. For this purpose, in some implementations, the distance from the top of the first dielectric layer 19 to the top of the gate structure 24 is from 200 angstroms to 400 angstroms.

In particular, the first dielectric layer 19 exposes the top of the source/drain doped layer 13, so that the self-aligned stop layer 21 can be located on the side wall of the gate structure 24 exposed from the source/drain doped layer 13. In a contact etching step of forming the contact plug 26, the self-aligned stop layer can protect the side wall of the gate structure 24 exposed from the source/drain doped layer 12, which facilitates improvement of an effect of self-alignment of the self-aligned stop layer 21 for achieving the contact etching process and reduction of a probability of causing a loss to the side wall of the gate structure 24 in the contact etching process.

In some implementations, the top of the first dielectric layer 19 is flush with the top of the source/drain doped layer 13, which facilitates further reduction of an influence on the source/drain doped layer 13 from process steps of forming the first dielectric layer 19.

In some implementations, the semiconductor structure further includes a contact etch stop layer 17 covering the gate structure 24, the side walls, and the base 100 exposed from the gate structure 24. The contact etch stop layer 17 is configured to define a longitudinal etch stop position of the contact etching process, to reduce a probability of causing a damage to the source/drain doped layer 13 in the contact etching process. In some implementations, the contact etch stop layer 17 is made of silicon nitride.

Correspondingly, the first dielectric layer 19 further covers the contact etch stop layer 17.

The second dielectric layer 23 is also configured to achieve electrical isolation between adjacent devices.

The second dielectric layer 23 is made of a dielectric material such as one or more of silicon oxide, silicon nitride, silicon oxynitride, silicon oxycarbide, silicon carbonitride, and silicon oxycarbonitride. In some implementations, the second dielectric layer 23 is made of a material same as that of the first dielectric layer 19, and the second dielectric layer 23 is made of silicon oxide.

The contact plug 26 is configured to achieve an electrical connection of the source/drain doped layer 13 to an external circuit or other interconnecting structures.

In some implementations, the source/drain contact plug 26 is made of copper, which facilitates improvement of a signal delay of a back end of line RC and improvement of a processing speed of a chip, and also facilitates reduction of a resistance of the contact plug 26 and reduction of power consumption correspondingly. In other implementations, the contact plug may also be made of tungsten or cobalt.

In order to ensure that the self-aligned stop layer 21 can define the stop position in the direction perpendicular to the side wall of the gate structure 24 in the contact etching process, the self-aligned stop layer 21 is made of a material having a relatively large etch selection with a material of the second dielectric layer 23. In particular, in the contact etching process, an etch selection ratio of the material of the second dielectric layer 23 to the material of the self-aligned stop layer 21 is greater than 5:1.

The self-aligned stop layer 21 may be made of silicon nitride, aluminium oxide, aluminium nitride, or NDC. There is a relatively large etch selection ratio between the second dielectric layer 23 and the material, so that it can be ensured that the self-aligned stop layer 21 can achieve a corresponding process effect.

In some implementations, the self-aligned stop layer 21 is made of silicon nitride. Silicon nitride is a material commonly used in a semiconductor process that facilitates improvement of process compatibility.

The self-aligned stop layer 21 should be neither excessively thin nor excessively thick. If the self-aligned stop layer 21 is excessively thin, not only a thickness of the self-aligned stop layer 21 is likely to be less than an overlay shift of the contact etching process, which is likely to cause mis-etching on the gate structure 24 in the contact etching process, but also the self-aligned stop layer 21 is likely to be removed prematurely in the contact etching process, reducing a self-alignment effect of the self-aligned stop layer 21. If the self-aligned stop layer 21 is excessively thick, not only a time for forming the self-aligned stop layer 21 is likely to be excessively long, resulting in a process time and material waste, but also self-aligned stop layers 21 on the side walls of the adjacent gate structures 24 are likely to be excessively close, and remaining space between the adjacent gate structures 24 is likely to be excessively small, or the self-aligned stop layers 21 on the side walls of the adjacent gate structures 24 may contact with each other, increasing difficulty in forming the contact 26. For this purpose, in some implementations, the self-aligned stop layer 21 has a thickness from 5 nanometers to 15 nanometers.

In some implementations, the self-aligned stop layer 21 is located only between the contact plug 26 and the side wall of the gate structure 24. In other implementations, the self-aligned stop layer may be further located between the second dielectric layer and the first dielectric layer.

The semiconductor structure further includes: a third dielectric layer 25 covering the gate structure 24 and the second dielectric layer 23.

The third dielectric layer 25 is configured to provide a process platform for subsequently forming a gate contact plug electrically connected to the gate structure 24, and the third dielectric layer 25 is further configured to achieve isolation between adjacent interconnecting structures. In some implementations, the third dielectric layer 25 is made of a material same as that of the second dielectric layer 23, and the third dielectric layer 25 is made of silicon oxide.

Therefore, the contact plug 26 penetrates through the third dielectric layer 25 and the interlayer dielectric layer 110 between the adjacent gate structures 24.

The semiconductor structure may be formed using the forming method according to the foregoing embodiments, or may be formed using other forming methods. For detailed description of the semiconductor structure in some implementations, reference can be made to the corresponding descriptions in the foregoing embodiments, and details are not described again in some implementations.

Although the present disclosure is disclosed as above, the present disclosure is not limited thereto. Various alterations and modifications may be made by a person skilled in the art without departing from the spirit and scope of the present disclosure, and therefore, with regard to the scope of protection of the present disclosure, the scope defined in the claims shall prevail.

What is claimed is:

1. A method for forming a semiconductor structure, comprising:
   providing a base, wherein a dummy gate structure is formed on the base, and a source/drain doped layer is formed within the base on both sides of the dummy gate structure;
   forming a first dielectric layer on the base exposed from the dummy gate structure, the first dielectric layer exposing a portion of a side wall of the dummy gate structure;
   forming a self-aligned stop layer on at least the side wall of the dummy gate structure exposed from the first dielectric layer;
   after the self-aligned stop layer is formed, forming a second dielectric layer on the first dielectric layer, the second dielectric layer exposing a top of the dummy gate structure, wherein the second dielectric layer and the first dielectric layer are used as an interlayer dielectric layer;
   after the second dielectric layer is formed, replacing the dummy gate structure with a gate structure;
   etching the interlayer dielectric layer between self-aligned stop layers on side walls of the adjacent gate structures to form a contact opening exposing a top of the source/drain doped layer; and
   forming a contact plug within the contact opening, the contact plug being electrically connected to the source/drain doped layer.

2. The method for forming a semiconductor structure according to claim 1, wherein the step of forming the first dielectric layer comprises:
   forming a first dielectric material layer on the base exposed from the dummy gate structure;
   exposing, from the first dielectric material layer, the top of the dummy gate structure; and
   removing a portion of a thickness of the first dielectric material layer, and using a remainder of the first dielectric material layer as the first dielectric layer.

3. The method for forming a semiconductor structure according to claim 2, wherein the portion of the thickness of the first dielectric material layer is removed using a dry etching process.

4. The method for forming a semiconductor structure according to claim 1, wherein in the step of forming the first dielectric layer, the first dielectric layer exposes the top of the source/drain doped layer.

5. The method for forming a semiconductor structure according to claim 1, wherein in the step of forming the self-aligned stop layer, the self-aligned stop layer is located on the side wall of the dummy gate structure exposed from the first dielectric layer.

6. The method for forming a semiconductor structure according to claim 5, wherein the step of forming the self-aligned stop layer comprises:
   forming a self-aligned stop material layer that covers the dummy gate structure exposed from the first dielectric layer and the base conformally; and
   removing the self-aligned stop material layer on the top of the dummy gate structure and the base, and using a remainder of the self-aligned stop material layer as the self-aligned stop layer.

7. The method for forming a semiconductor structure according to claim 1, wherein:
   in the step of forming the self-aligned stop layer, the self-aligned stop layer covers the dummy gate structure exposed from the first dielectric layer and the base conformally; and
   the step of forming the contact opening further comprises: etching the self-aligned stop layer on the base.

8. The method for forming a semiconductor structure according to claim 7, wherein:
   the step of forming the second dielectric layer comprises:
      forming a second dielectric material layer on the first dielectric layer, the second dielectric material layer covering the self-aligned stop layer on the top of the dummy gate structure;
      removing the second dielectric material layer above the top of the dummy gate structure, and
      using a remainder of the second dielectric material layer as the second dielectric layer; and
   in the step of removing the second dielectric material layer above the top of the dummy gate structure, a self-aligned stop layer above the top of the dummy gate structure is removed.

9. The method for forming a semiconductor structure according to claim 8, wherein the step of removing the second dielectric material layer above the top of the dummy gate structure comprises:
   performing a first flattening treatment on the second dielectric material layer using a top surface of the self-aligned stop layer on the top of the dummy gate structure as a stop position; and performing a second flattening treatment on the second dielectric material layer and the self-aligned stop layer using the top of the dummy gate structure as a stop position, after the first flattening treatment is performed.

10. The method for forming a semiconductor structure according to claim 1, wherein a process for forming the self-aligned stop layer comprises an atomic layer deposition process.

11. The method for forming a semiconductor structure according to claim 1, wherein in the step of forming the self-aligned stop layer, the self-aligned stop layer has a thickness from 5 nanometers to 15 nanometers.

12. The method for forming a semiconductor structure according to claim 1, wherein in the step of forming the self-aligned stop layer, the self-aligned stop layer is made of silicon nitride, aluminium oxide, aluminium nitride, or NDC.

13. The method for forming a semiconductor structure according to claim 6, wherein the self-aligned stop material layer on the top of the dummy gate structure and the base is removed using a dry etching process.

14. The method for forming a semiconductor structure according to claim 1, wherein the step of forming the contact opening comprises:
forming a mask layer on the interlayer dielectric layer, the mask layer having a mask opening, and being suitable for defining a position and a shape for etching the contact opening; and
etching the interlayer dielectric layer using the mask layer as a mask to form the contact opening exposing the top of the source/drain doped layer.

15. The method for forming a semiconductor structure according to claim 14, wherein:
after the gate structure is formed and before the contact opening is formed, the method further comprises: forming a third dielectric layer covering the gate structure and the second dielectric layer;
in the step of forming the mask layer, the mask layer is located on the third dielectric layer, and the mask opening exposes a portion of the top of the third dielectric layer between the adjacent gate structures; and
before the interlayer dielectric layer is etched, the method further comprises: etching the third dielectric layer using the mask layer as a mask.

16. The method for forming a semiconductor structure according to claim 1, wherein in the step of forming the first dielectric layer, a distance from the top of the first dielectric layer to the top of the dummy gate structure is from 200 angstroms to 400 angstroms.

17. A semiconductor structure, comprising:
a base;
a gate structure located on the base;
a source/drain doped layer located within the base on both sides of the gate structure;
an interlayer dielectric layer located on the base exposed from the gate structure, the interlayer dielectric layer exposing a top of the gate structure, the interlayer dielectric layer comprising a first dielectric layer and a second dielectric layer located on the first dielectric layer, the first dielectric layer covering a portion of a side wall of the gate structure, and a top surface of the first dielectric layer being flush with a top surface of the source/drain doped layer;
a contact plug located within the interlayer dielectric layer between side walls of the adjacent gate structures, the contact plug being electrically connected to the source/drain doped layer; and
a self-aligned stop layer located between at least the contact plug and the side wall of the gate structure.

18. The semiconductor structure according to claim 17, wherein the first dielectric layer exposes the top of the source/drain doped layer.

19. The semiconductor structure according to claim 17, wherein the self-aligned stop layer has a thickness from 5 nanometers to 15 nanometers.

20. The semiconductor structure according to claim 17, wherein the self-aligned stop layer is made of silicon nitride, aluminium oxide, aluminium nitride, or NDC.

21. The semiconductor structure according to claim 17, wherein:
the semiconductor structure further comprises: a third dielectric layer covering the gate structure and the second dielectric layer; and
the contact plug penetrates through the third dielectric layer and the interlayer dielectric layer between the side walls of the adjacent gate structures.

22. The semiconductor structure according to claim 17, wherein a distance from the top of the first dielectric layer to the top of the gate structure is from 200 angstroms to 400 angstroms.

* * * * *